(12) United States Patent
Tanida et al.

(10) Patent No.: US 8,338,904 B2
(45) Date of Patent: Dec. 25, 2012

(54) SEMICONDUCTOR DEVICE AND METHOD FOR MANUFACTURING THE SAME

(75) Inventors: Kazumasa Tanida, Kawasaki (JP); Chiaki Takubo, Sumida-ku (JP); Hideo Numata, Yokohama (JP); Yoshihisa Imori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 210 days.

(21) Appl. No.: 12/883,674

(22) Filed: Sep. 16, 2010

(65) Prior Publication Data

US 2011/0073983 A1   Mar. 31, 2011

(30) Foreign Application Priority Data

Sep. 30, 2009   (JP) .................. 2009-227207

(51) Int. Cl.
*H01L 31/05* (2006.01)

(52) U.S. Cl. ............. 257/460; 257/758; 257/E31.111; 257/E31.112; 257/E31.113; 257/E31.114; 438/622

(58) Field of Classification Search .......... 257/460, 257/758, E31.111–E31.114; 438/622
See application file for complete search history.

(56) References Cited

U.S. PATENT DOCUMENTS

| 6,930,327 | B2 * | 8/2005 | Maeda et al. | 257/59 |
|---|---|---|---|---|
| 7,202,563 | B2 | 4/2007 | Imoto et al. | |
| 7,564,079 | B2 * | 7/2009 | Mabuchi et al. | 257/229 |
| 2002/0131548 | A1 * | 9/2002 | Doubrava et al. | 378/19 |
| 2006/0197007 | A1 | 9/2006 | Iwabuchi et al. | |
| 2008/0073780 | A1 | 3/2008 | Imori | |
| 2009/0057539 | A1 | 3/2009 | Iwabuchi et al. | |
| 2009/0065681 | A1 | 3/2009 | Iwabuchi et al. | |
| 2009/0102002 | A1 * | 4/2009 | Chia et al. | 257/433 |
| 2009/0140365 | A1 * | 6/2009 | Lee et al. | 257/460 |
| 2010/0059843 | A1 * | 3/2010 | Ikuta et al. | 257/432 |
| 2010/0244175 | A1 * | 9/2010 | Park | 257/459 |

FOREIGN PATENT DOCUMENTS

JP   2007-013089   1/2007

* cited by examiner

*Primary Examiner* — Allan R Wilson
(74) *Attorney, Agent, or Firm* — Turocy & Watson, LLP

(57) ABSTRACT

According to an embodiment, there is provided a semiconductor device including a semiconductor substrate having a first surface on which an active layer having a light receiving portion is provided and a second surface to be a light receiving surface for the light receiving portion, a wiring layer provided on the active layer, an insulating layer provided to cover the wiring layer, and a supporting substrate joined to the semiconductor substrate via the insulating layer to face the first surface of the semiconductor substrate. A joined body of the semiconductor substrate and the supporting substrate includes an intercalated portion provided between its outer peripheral surface and the active surface. The intercalated portion is provided to penetrate the semiconductor substrate and the insulating layer from the second surface of the semiconductor substrate and to reach inside the supporting substrate.

11 Claims, 6 Drawing Sheets

SEMICONDUCTOR DEVICE AND METHOD FOR MANUFACTURING THE SAME

CROSS REFERENCE TO RELATED APPLICATION

This application is based upon and claims the benefit of priority from the prior Japanese Patent Application No. 2009-227207, filed on Sep. 30, 2009; the entire contents of which are incorporated herein by reference.

FIELD

Embodiments described herein relate generally to a semiconductor device and a method for manufacturing the same.

BACKGROUND

Semiconductor devices such as a CCD and a CMOS image sensor using semiconductor integrated circuit technology are broadly used in a digital camera and a cellular phone having a camera function. As such a semiconductor device, there is suggested an image sensor of a rear surface irradiation type in which a light receiving portion having a light receiving element such as a photodiode is provided on a front surface of a semiconductor substrate and a light receiving surface (light irradiated surface) for the light receiving portion is provided on a rear surface of the semiconductor substrate (see JP-A 2007-013089 (KOKAI)). Since not requiring formation of a wiring or an extra film on the light receiving surface (rear surface of the semiconductor substrate), the rear surface irradiation type image sensor has an advantage that higher sensitivity than in a front surface irradiation type image sensor is possible.

In the rear surface irradiation type image sensor, in order to effectively collect light incident on the rear surface of the semiconductor substrate by the light receiving portion provided on the front surface, the semiconductor substrate is required to be thinned. A thickness of the semiconductor device is required to be made thin to be equal to or thinner than 20 μm in a case of incident of a visible light for example, and further to be equal to or thinner than 10 μm, in order to prevent an electric charge generated on the light receiving surface (rear surface) from diffusing before being collected by the light receiving portion, leading to deterioration of a resolution. A semiconductor device applied to such a rear surface irradiation type image sensor is fabricated as follows for example.

First, a light receiving portion having a light receiving element such as a photodiode and an integrated circuit is formed on a front surface of a semiconductor substrate (semiconductor wafer). Next, a supporting substrate (supporting wafer) of almost the same diameter is joined to the front surface of the semiconductor substrate. The supporting substrate functions as a reinforcing body in forming a light receiving surface by thinning the semiconductor substrate from its rear surface side to a neighborhood of the light receiving portion. Next, an anti-reflection film, a color filter, a light-collecting micro lens and the like are formed on the light receiving surface. Further, an external electrode connected to the integrated circuit of a front surface side is formed on a rear surface of the semiconductor substrate, a joined body of the semiconductor substrate and the supporting substrate is cut by a dicing blade, to be individualized into respective semiconductor devices (semiconductor chips).

In a manufacturing process of such a semiconductor device, a processing is performed by mechanical polishing or chemical mechanical polishing from the rear surface of the semiconductor substrate toward the front surface on which the light receiving portion is provided. With regard to the rear surface irradiation type image sensor, it is desirable that the semiconductor substrate is made as thin as possible. However, as a result that the semiconductor substrate is processed to be thin, a residual stress at a time of formation of the integrated circuit constituted by a metal wiring and an insulating film on the front surface of the semiconductor device is apt to concentrate on a joint surface of the semiconductor substrate and the supporting substrate.

As a joining method of the semiconductor substrate and the supporting substrate, there are known a bonding method using an organic bonding agent, a direct joining method in which a surface of a semiconductor substrate and a surface of a supporting substrate are inorganically joined, and so on. Whichever of the above joining method is applied, there is a problem that peeling is apt to occur from a joint interface in a chip end surface based on a stress concentrating on a joint surface when a joined body is individualized by a dicing blade. Peeling from the joint interface causes occurrence of separation of a semiconductor substrate and a supporting substrate or fracture of the semiconductor substrate, whereby a manufacturing yield of a semiconductor device is deteriorated. Even if a semiconductor device and a supporting substrate are not completely separated, progress of peeling into the inside of a joined body warps a thin semiconductor substrate considerably and deforms a light receiving surface, causing deterioration of an image pick-up characteristic.

DETAILED DESCRIPTION

According to an embodiment, there is provided a semiconductor device including a semiconductor substrate having a first surface on which an active layer having a light receiving portion is provided and a second surface to be a light receiving surface for the light receiving portion, a wiring layer provided on the active layer, an insulating layer provided to cover the wiring layer, and a supporting substrate joined to the semiconductor substrate via the insulating layer to face the first surface of the semiconductor substrate. A joined body of the semiconductor substrate and the supporting substrate includes an intercalated portion provided between its outer peripheral surface and the active layer. The intercalated portion is provided to penetrate the semiconductor substrate and the insulating layer from the second surface of the semiconductor substrate and to reach inside the supporting substrate.

According to another embodiment, there is provided a method for manufacturing a semiconductor device. The method includes forming an active layer having a light receiving portion each in a plurality of device regions in a first surface of a semiconductor substrate, forming a wiring layer each on the active layers in the device regions, forming an insulating layer on the first surface of the semiconductor substrate to cover the wiring layers in the device regions, joining a supporting substrate to the first surface of the semiconductor substrate via the insulating layer, thinning the semiconductor substrate joined to the supporting substrate from a second surface of the semiconductor substrate on a opposite side of the first surface to form a light receiving surface for the light receiving portions on the second surface of the semiconductor substrate, forming intercalated portions at positions between outer peripheral portions of the device regions and the active layers in a joined body of the semiconductor substrate and the supporting substrate to penetrate the semiconductor substrate and the insulation layer from the second surface of the semiconductor substrate and to reach inside the supporting substrate, and sectioning semiconductor devices from the joined body by cutting the joined body along the device regions.

Figure 1:
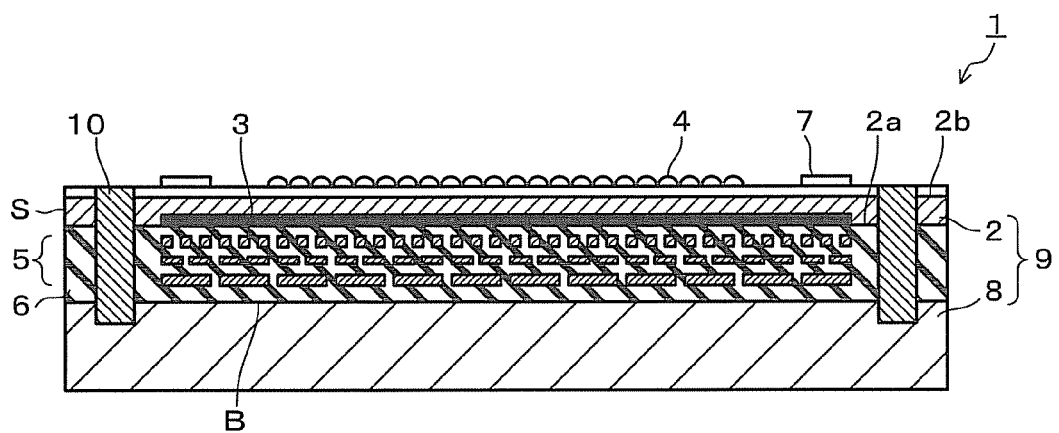
FIG. 1 is a cross-sectional view showing a semiconductor device according to an embodiment.

Hereinafter, a semiconductor device of an embodiment and a method for manufacturing the same will be described with reference to the drawings. FIG. 1 shows a constitution of the semiconductor device of the embodiment. A semiconductor device 1 shown in FIG. 1 includes a semiconductor substrate 2. A silicon (Si) substrate or the like is used for the semiconductor substrate 2. The semiconductor substrate 2 has a first surface 2a and a second surface 2b on the opposite side thereof. The first surface (front surface) 2a is a forming surface of an active layer 3 having a light receiving portion, while the second surface (rear surface) 2b is a light receiving surface for the light receiving portion. The semiconductor device 1 constitutes a rear surface irradiation type image sensor or the like.

The active layer 3 is provided on the first surface 2a of the semiconductor substrate 2. The active layer 3 has a photodiode, a phototransistor or the like functioning as a light receiving element, which constitutes the light receiving portion. The second surface 2b of the semiconductor substrate 2 is the light receiving surface for the light receiving portion. In other words, the light receiving portion provided on the first surface 2a of the semiconductor substrate 2 receives an energy line such as light and an electron irradiated to the second surface (light receiving surface) 2b of the semiconductor substrate 2 via the semiconductor substrate 2 thereby to collect the energy line into the photodiode or the like. An anti-reflection film or a color filter (not shown), and a micro lens 4 and so on are formed as necessary on the second surface 2b being the light receiving surface.

The semiconductor substrate 2 is thinned so that the energy line such as light and an electron irradiated to the second surface 2b can be received in the light receiving portion of the active layer 3 provided on the first surface 2a. It is preferable that a thickness of the semiconductor substrate 2 is equal to or thinner than 20 µm in a case of incident of visible light and it is further preferable that the thickness of the semiconductor substrate 2 is equal to or thinner than 10 µm. If the thickness of the semiconductor substrate 2 exceeds 20 µm, an electric charge generated by irradiation of visible light to the second surface (light receiving surface) 2b is apt to diffuse before being collected into the light receiving portion, making a resolution of a rear surface irradiation type image sensor apt to be deteriorated.

A wiring layer 5 electrically connected to the active layer 3 is provided on the first surface 2a of the semiconductor substrate 2, and the wiring layer 5 is covered with an insulating layer 6. An external electrode 7 is provided on the second surface 2b of the semiconductor substrate 2. The external electrode 7 is electrically connected to the active layer 3 and the wiring layer 5 via a through electrode or the like, which is not shown. The external electrode 7 is disposed outside a light receiving region (region in which the micro lens 4 or the like is formed) in the second surface (light receiving surface) 2b of the semiconductor substrate 2 in order not to disturb light irradiation to the light receiving portion of the active layer 3.

The semiconductor substrate 2 is joined to a supporting substrate 8 via the insulating layer 6. To the supporting substrate 8, a semiconductor substrate such as Si substrate, a glass substrate made of borosilicate glass, quartz glass or soda-lime glass, or a resin substrate made of an epoxy resin or a polyimide resin is applied. The supporting substrate 8 functions as a reinforcing body at a time of thinning the semiconductor substrate 2 from the second surface 2b, and it is preferable that its thickness is in a range of 70 µm to 800 µm. The supporting substrate 8 is joined to the insulating layer 6 in a manner to face the first surface 2a of the semiconductor substrate 2. A joined body 9 of the semiconductor substrate 2 and the supporting substrate 8 is made by joining the first surface 2a of the semiconductor substrate 2 and one surface of the supporting substrate 8 via the insulating layer 6 in a manner that the second surface 2b of the semiconductor substrate 2 is exposed to become the receiving surface.

The semiconductor device 1 having the external electrode 7 provided on the second surface 2b of the semiconductor substrate 2 is mounted to a package base made of a ceramic substrate, a resin substrate or the like for example by joining the supporting substrate 8 thereto. The external electrode 7 and an electrode of the package base are wire-bonded and the semiconductor device 1 is packaged by a cap, a resin or the like, whereby a camera module or the like including the semiconductor device 1 is constituted. A connecting structure of the semiconductor device 1 to the outside is not limited to the above. For example, it is possible to provide a through electrode or a side surface electrode electrically connected to the wiring layer 5 on the supporting substrate 8 and to provide an external electrode on a rear surface (surface in the opposite side of a joint surface) of the supporting substrate 8. According to such a structure, a chip size package can be constituted.

It should be noted that an external electrode can be provided in both of the semiconductor substrate 2 and the supporting substrate 8.

An intercalated portion 10 is provided between an outer peripheral surface S of the joined body 9 of the semiconductor substrate 2 and the supporting substrate 8, and the active layer 3. The intercalated portion 10 is provided in a manner to penetrate the semiconductor substrate 2 and the insulating layer 6 from the second surface 2*b* of the semiconductor substrate 2 to reach the inside of the supporting substrate 8. Since the intercalated portion 10 is formed at a position apart from the outer peripheral surface S of the joined body 9, end surfaces of the semiconductor substrate 2, the insulating layer 6 and the supporting substrate 8 are exposed to the outer peripheral surface S of the joined body 9. The intercalated portion 10 is provided between the active layer 3 and the outer peripheral surface S to which the end surfaces of the semiconductor substrate 2, the insulating layer 6 and the supporting substrate 8 are exposed. The active layer 3 is apart from the outer peripheral surface S of the joined body 9 via the intercalated portion 10.

The intercalated portion 10 suppresses progress of peeling from a joint surface B of the semiconductor substrate 2 and the supporting substrate 8 in fabricating the semiconductor device 1 by cutting the wafer-shaped joined body 9 of the semiconductor substrate 2 and the supporting substrate 8. Since the intercalated portion 10 reaching the inside of the supporting substrate 8 from the second surface 2*b* of the semiconductor substrate 2 is provided inner (at a position apart from the end surface) than a cross section (surface to which the end surfaces of the semiconductor substrate 2, the insulating layer 6 and the supporting substrate 8 are exposed), progress of peeling is obstructed by the intercalated portion 10 even if peeling occurs along the joint surface B in the cross section of the joined body 9. Since the intercalated portion 10 is provided at the position apart from the cross section, a depth and a width of the intercalated portion 10 in the supporting substrate 8 contribute to suppression of progress of peeling. Therefore, it becomes possible to prevent progress of peeling having occurred in the cross section more effectively.

When peeling having occurred along the joint surface B from the cross-section (outer peripheral surface) of the joined body 9 progresses to the inside of the joined body 9, separation of the semiconductor substrate 2 and the supporting substrate 8, fracture of the semiconductor substrate 2 and so on become apt to occur, causing deterioration of a manufacturing yield of the semiconductor device 1. Further, progress of peeling deteriorates mechanical reliability of the semiconductor device 1, or causes occurrence of warpage or distortion in the light receiving surface 2*b* of the semiconductor 2. When warpage or distortion occurs in the light receiving surface 2*b*, a performance characteristic such as an image pick up characteristic of the semiconductor device 1 is deteriorated. Responding to the above, by obstructing progress of peeling having occurred in the cross section by means of the intercalated portion 10, the manufacturing yield of the semiconductor device 1 can be increased and the reliability and the performance characteristic such as an image pick up characteristic of the semiconductor device 1 can be improved.

Figure 2:
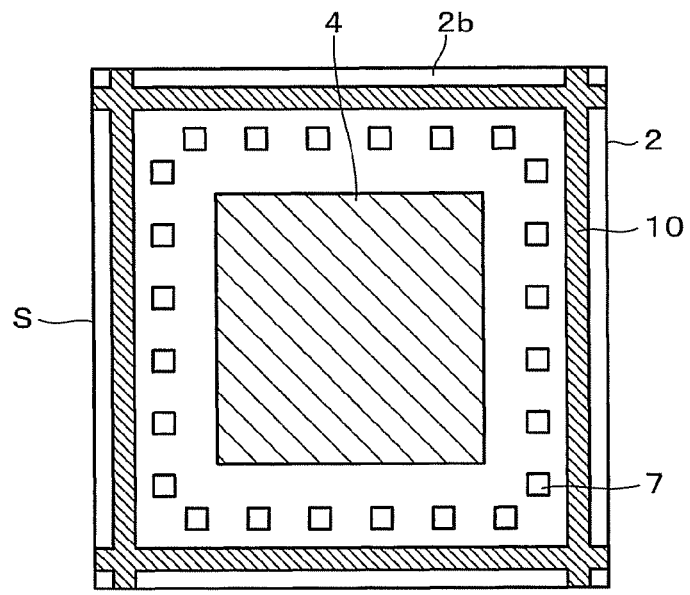
FIG. 2 is a plan view showing an example of a light receiving surface of the semiconductor device shown in FIG. 1.
Figure 3:
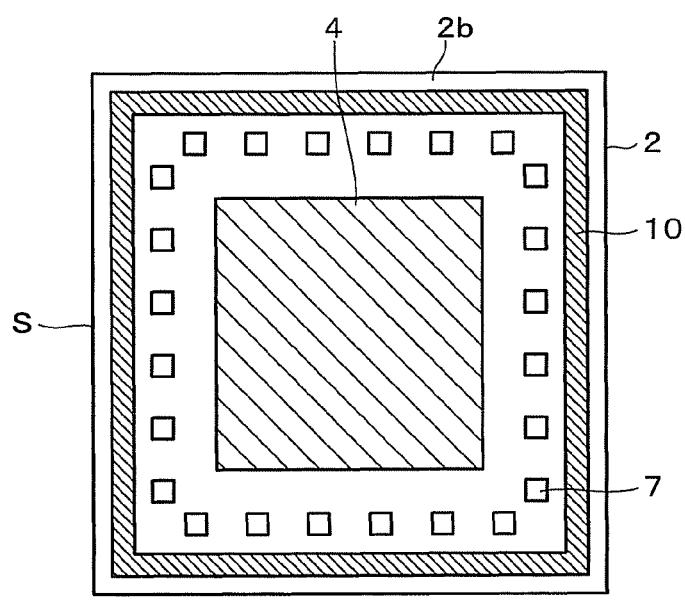
FIG. 3 is a plan view showing another example of the light receiving surface of the semiconductor device shown in FIG. 1.

It is preferable that in a plan view of the semiconductor device 1, the intercalated portion 10 is provided in a manner to surround the active layer 3 including a micro lens (light collecting portion) 4 and the external electrode 7 as shown in FIG. 2 and FIG. 3. FIG. 2 shows an intercalated portion 10 in a sharp sign shape while FIG. 3 shows an intercalated portion in a rectangular shape. Application of such an intercalated portion 10 can effectively suppress reaching of peeling having occurred in the cross section of the joined body 9 to the active layer 3 or the external electrode 7 (including a wiring connecting the external electrode 7 and the active layer 3 or the wiring layer 5). However, the intercalated portion 10 can be provided partially (intermittently) between the outer peripheral surface S of the joined body 9 and the active layer 3 in a shape of not surrounding the active layer 3. A planar shape of the intercalated portion 10 is not limited to the sharp sign shape or the rectangular shape but can be polygonal or curved.

Next, a concrete constitution of the intercalated portion 10 will be described with reference to FIG. 4, FIG. 5, and FIG. 6. The intercalated portion 10 has a groove 11 (11A, 11B) penetrating the semiconductor substrate 2 and the insulating layer 6 from the second surface 2*b* of the semiconductor substrate 2 and reaching the inside of the supporting substrate 8. The groove 11 is formed by etching, laser grooving or the like. It is preferable that the groove 11 is formed to have a width w and a depth d in the supporting substrate 8 at a position apart from the outer peripheral surface S of the joined body 9. By applying the groove as described above as the intercalated portion 10, a suppressing effect of progress of peeling can be attained.

It is preferable that a distance m of the groove 11 from the outer peripheral surface S is in a range of 5 µm to 300 µm. It is preferable that a width w of the groove 11 is in a range of 5 µm to 100 µm and that a depth d is in a range of 1 µm to 20 µm. If the distance m from the outer peripheral surface S or the width w of the groove 11 is smaller than 5 µm, there is a possibility that the suppressing effect of progress of peeling by the intercalated portion 10 can not be obtained effectively. If the distance m of the groove 11 from the outer peripheral surface S exceeds 300 µm or the width w exceeds 100 µm, a forming region of the active layer 3 in the semiconductor substrate 2 is relatively decreased, leading to size increase of the semiconductor device 1 or deterioration of a formation density of the light receiving portion.

If the depth d of the groove 11 in the supporting substrate 8 is smaller than 1 µm, there is a possibility that the effect of forming the intercalated portion 10 in a manner to reach the inside of the supporting substrate 8 is weakened, disabling sufficient suppression of progress of peeling. Even if the groove 11 whose depth d exceeds 20 µm is formed, a greater effect cannot be obtained and there is a possibility that strength reduction of the supporting substrate 8 is brought. It is more preferable that the distance m from the outer peripheral surface S and the width w of the groove 11 are in a range of 5 µm to 60 µm.

Figure 4:
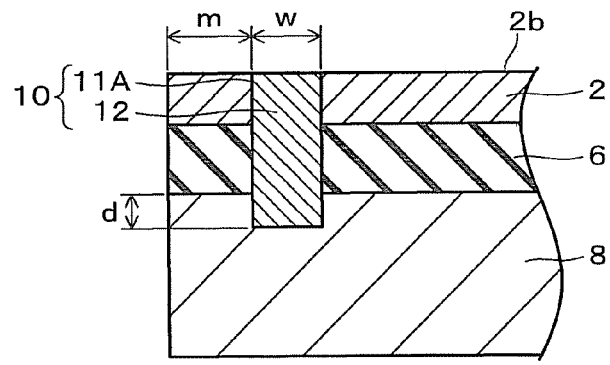
FIG. 4 is a cross-sectional view showing a first example of an intercalated portion in the semiconductor device shown in FIG. 1.

In a case of forming the groove 11A by an etching method, it is preferable that a filling layer 12 is formed by embedding a metal material or an insulating material in the inside of the grove A as shown in FIG. 4. Thereby, the suppression effect of progress of peeling by the intercalated portion 10 can be further increased. It is possible not only that the inside of the groove A is in a state of being embedded with the metal material or the insulating material but also that an inner wall surface of the groove 11A is covered with a cover layer 13 as shown in FIG. 5. It is preferable that the intercalated portion 10 has at least the cover layer 13 (including the filling layer 12) covering the inner wall surface of the groove 11A.

The metal material or the insulating material forming the filling layer 12 and the cover layer 13 of the intercalated portion 10 is not limited in particular. As the metal material, there is used a single-layered body or a laminated body of a high-resistance metal material (Ti, TiN, TiW, Ni, Cr, TaN, CoWP, and so on) or a low-resistance metal material (Al, Al—Cu, Al—Si—Cu, Cu, Au, Ag and so on). As the insulating material, there is used an inorganic insulating substance such as a silicon oxide ($SiO_x$), a silicon nitride ($SiN_x$), a fluorine-doped silicon oxide (SiOF), a carbon-doped silicon oxide (SiOC) or the like, or an organic insulating substance such as a polyimide resin, a benzocyclobutene (BCB) resin, an epoxy resin or the like.

Figure 6:
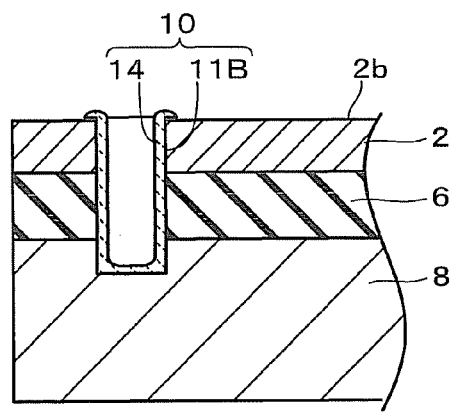
FIG. 6 is a cross-sectional view showing a third example of the intercalated portion in the semiconductor device shown in FIG. 1.

When the groove 11B is formed by a laser grooving method, as shown in FIG. 6, an inner wall surface of the groove 11B is covered with an alteration layer 14 generated in laser grooving. The alteration layer 14 is made of a molten substance or the like generated in processing the semiconductor substrate 2 or the supporting substrate 8 by laser light, its main component being a constitutional material (for example, Si) of the semiconductor substrate 2 or the supporting substrate 8 and an oxide thereof and a forming material of the insulating layer 6 or a forming material of the wiring layer 5 being mixed thereinto. It is possible to apply the alteration layer 14 as above as a cover layer, and a similar effect can be also obtained thereby. In a case that the laser grooving method is applied, since it is unnecessary to use a mask and the groove 11B and the alteration layer (cover layer) 14 are obtained simultaneously, it becomes possible to reduce a manufacturing cost of the semiconductor device 1.

Figure 7:
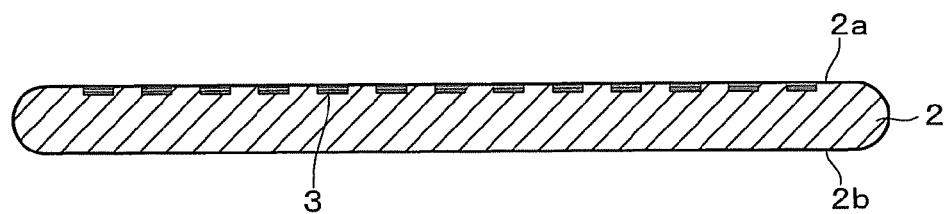
FIG. 7 is a diagram showing a forming process of an active layer in a method for manufacturing according to an embodiment.
Figure 8:
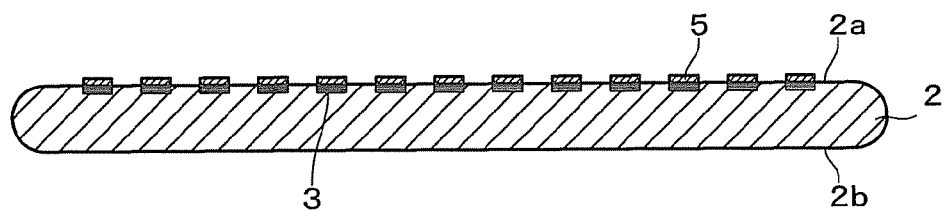
FIG. 8 is a diagram showing a forming process of a wiring layer in a method for manufacturing according to an embodiment.
Figure 9:
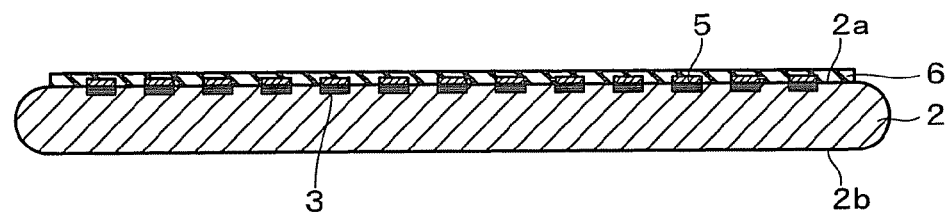
FIG. 9 is a diagram showing a forming process of an insulating layer in a method for manufacturing according to an embodiment of the present invention.

The semiconductor device 1 of the embodiment is fabricated as follows for example. First, as shown in FIG. 7, active layers 3 having a photodiode, a transistor, a circuit connecting the photodiode and the transistor, and so on, are formed on a first surface 2a of a semiconductor substrate 2. The semiconductor substrate 2 is supplied in a wafer state. The active layer 3 is each formed on a plurality of device regions in the first surface 2a of the semiconductor substrate (semiconductor wafer) 2. Next, as shown in FIG. 8, a wiring layer 5 is each formed on the active layer 3 in the plural device regions. Further, as shown in FIG. 9, an insulating layer 6 is formed on the first surface 2a of the semiconductor substrate 2 in a manner to cover the wiring layers 5 in the device regions.

The wiring layer 5 is formed for example by using a mask (not shown) of a predetermined pattern by applying a sputtering method, a CVD method, a vapor disposition method, a plating method or the like. To the wiring layer 5, there is applied a high-resistance metal material (Ti, TiN, TiW, Ni, Cr, TaN, CoWP, and so on) or a low-resistance metal material (Al, Al—Cu, Al—Si—Cu, Cu, Au, Ag, solder and so on) for example. Such a material constitutes the wiring layer 5 as a single-layered film or a stacked film made by stacking a plurality of material layers. It is possible to apply a wiring layer 5 of a multi-layered structure made by stacking conductive layers via interlayer insulating films.

The insulating layer 6 is formed by applying a CVD method, a spray coating method, a spin coating method or the like. As the insulating layer 6, there is used an inorganic insulating substance such as a silicon oxide ($SiO_x$), a silicon nitride ($SiN_x$), a fluorine-doped silicon oxide (SiOF), a carbon-doped silicon oxide (SiOC) and porous bodies thereof or the like, or an organic insulating substance such as a polyimide resin, a benzocyclobutene (BCB) resin, an epoxy resin or the like. The insulating layer 6 is not limited to having a single-layered structure but can have a multi-layered structure made by stacking a plurality of material layers. A surface of the insulating layer 6 is planarized by chemical mechanical polishing (CMP) or the like as necessary.

Figure 10:
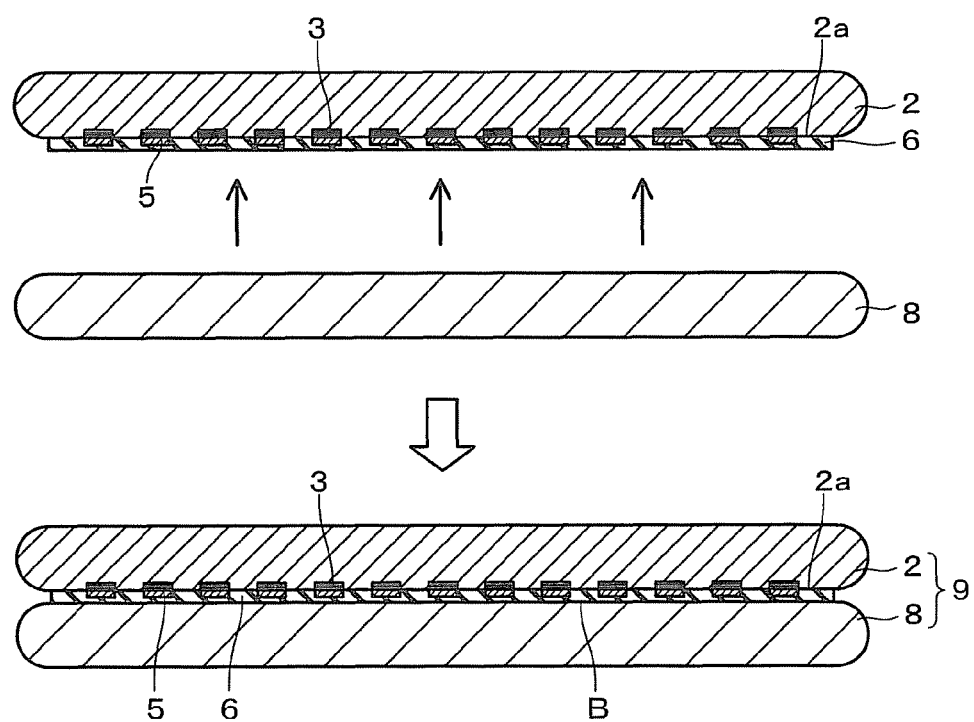
FIG. 10 is a diagram showing a joining process of a semiconductor substrate and a supporting substrate in a method for manufacturing according to an embodiment.

Next, as shown in FIG. 10, a supporting substrate 8 is adhered on the first surface 2a of the semiconductor substrate 2 via the insulating layer 6. The supporting substrate 8 has almost the same size as that of the semiconductor substrate 2, and, in specific, is joined to the insulating layer 6. A joining method of the semiconductor substrate 2 and the supporting substrate 8 is not limited in particular, and it is possible to apply, for example, an adhering method using an organic adhesive such as an epoxy resin, a polyimide resin, an acrylic resin, a silicone resin, a BCB resin or the like, a direct joining method by anodic oxidation or spontaneous joining (for example, direct joining by Si and Si or $SiO_x$ and $SiO_x$), and a joining method by metal films of gold, copper, tin, an alloy thereof or the like. A joint surface of the supporting substrate 8 can be constituted by a single-layered film or a laminated film of silicon, a silicon oxide, a silicon nitride or the like.

Figure 11:
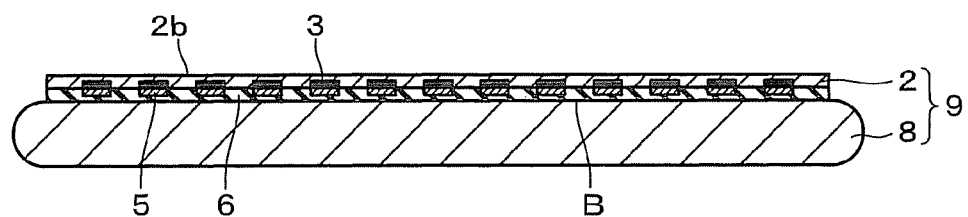
FIG. 11 is a diagram showing a film thinning process (processing process) of a semiconductor substrate in a method for manufacturing according to an embodiment.

Next, as shown in FIG. 11, the semiconductor substrate 2 joined to the supporting substrate 8 is thinned from a second surface 2b, so that a light receiving surface of a light receiving portion is formed on the second surface 2b of the semiconductor substrate 2. To film thinning of the semiconductor substrate 2, mechanical polishing, chemical mechanical polishing (CMP), wet etching, dry etching or the like is applied. The above can be combined and applied. The semiconductor substrate 2 is thinned to a thickness enabling the photodiode formed in the active layers 3 in the first surface 2a to collect an energy line such as light or an electron irradiated to the second surface (light receiving surface) 2b of the semiconductor substrate 2. It is preferable that a thickness of the semiconductor substrate 2 is equal to or thinner than 20 µm in a case of receiving visible light for example and further equal to or thinner than 10 µm. Then, an external electrode, a micro lens and the like (not shown) are formed on the second surface 2b of the semiconductor substrate 2.

Figure 12:
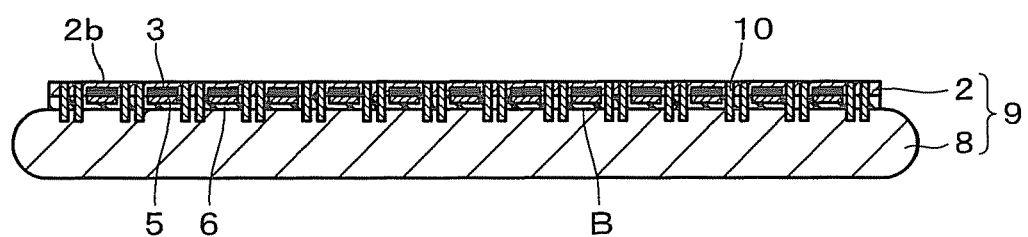
FIG. 12 is a diagram showing a forming process of an intercalated portion in a method for manufacturing according to an embodiment.

Next, as shown in FIG. 12, intercalated portions 10 are formed in a joined body 9 of the semiconductor substrate 2 and the supporting substrate 8. The intercalated portions 10 are formed at positions between outer peripheral portions of the device regions in the semiconductor substrate 2 and the active layers 3, from the second surface 2b of the semiconductor substrate 2. A forming process of the intercalated portion 10 can be performed before formation of the external electrode, micro lens and the like. It is preferable that the intercalated portion 10 is formed along the outer peripheral portion of the device region equivalent to the semiconductor device 1 in a manner to surround the active layer 3 and the external electrode 7 as shown in FIG. 2 and FIG. 3, but can be formed partially as stated above.

Figure 5:
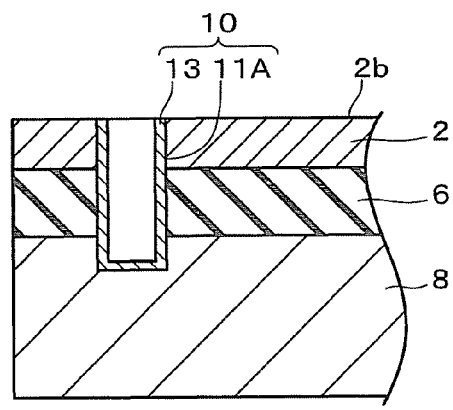
FIG. 5 is a cross-sectional view showing a second example of the intercalated portion in the semiconductor device shown in FIG. 1.

In forming the intercalated portion 10, first, there is formed a groove 11 which penetrates the semiconductor substrate 2 and the insulating layer 6 from the second surface 2b of the semiconductor substrate 2 joined to the supporting substrate 8 and which reaches the inside of the supporting substrate 8 (see FIG. 4, FIG. 5, and FIG. 6). A shape (a distance m from an outer peripheral portion of the device region, a width w, a depth d in the supporting substrate 8) of the groove 11 is as described above. When an etching method is applied, the semiconductor substrate 2, the insulating layer 6 and the supporting substrate 8 are plasma etched for example by using a mask (not shown) of a predetermined pattern, whereby a groove 11A (see FIG. 4 and FIG. 5) is formed.

As gas for etching, mixed gas of $SF_6$, $O_2$ and Ar is used when the semiconductor substrate 2 or the supporting substrate 8 is made of Si substrate for example. Mixed gas of $C_5F_8$, $O_2$ and Ar is used when the insulating layer 6 is made of $SiO_x$ film or $SiN_x$ film. Subsequently, as shown in FIG. 4, a metal material or an insulating material is embedded inside the grove 11A thereby to form a filling layer 12, or as shown in FIG. 5, an inner wall of the groove 11A is covered with a metal material or an insulating material thereby to form a cover layer 13. To formation of the filling layer 12 or the cover layer 13, a sputtering method, a vapor deposition method, a plating method, a CVD method, a spin coating method, a spray coating method or the like can be applied.

When a laser grooving method is applied, laser light is irradiated from the second surface 2b of the semiconductor substrate 2 without using a mask, thereby to form a groove 11B (see FIG. 6) penetrating the semiconductor substrate 2 and the insulating layer 6 and reaching inside the supporting substrate 8. As a laser light source, there can be used a YAG (yttrium, aluminum, garnet) laser, a UV (solid ultra violet) laser, an excimer laser, a carbon dioxide gas ($CO_2$) laser or the like for example.

A wavelength region of the YAG laser is 355 nm, a wavelength regions of the UV laser are 213 nm and 266 nm (CLBO: cesium lithium triborate crystal), and 355 nm (CBO: cesium triborate crystal, LBO: lithium triborate crystal), and wavelength regions of the excimer laser are 193 nm (ArF), 248 nm (KrF), 308 nm (XeCl), 351 nm (XeF) and so on. When an Si substrate is applied to the semiconductor substrate 2 or the supporting substrate 8 and the insulating layer 6 is made of an $SiO_x$ film or an $SiN_x$ film, it is preferable to use the YAG laser with the wavelength 355 nm as the laser light source.

If the laser grooving method is applied to formation of the groove 11B, the groove 11B whose inner wall surface is covered with an alteration layer 14 is obtained as shown in FIG. 6. By the intercalated portion 10 constituted by the groove 11B formed by the laser grooving method and the alteration layer 14 covering the inner wall surface of the groove 11B also, a similar effect as that of the intercalated portion 10 constituted by the groove 11A formed by the plasma etching method, the filling layer 12 and the cover layer 13 can be obtained, and moreover, use of a mask is unnecessary and the groove 11B and the alteration layer 14 can be obtained simultaneously, so that a manufacturing cost of a semiconductor device 1 can be reduced.

Figure 13:
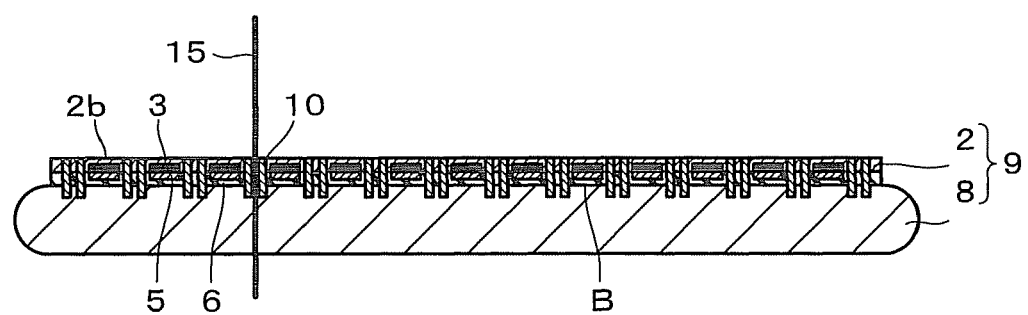
FIG. 13 is a diagram showing a cutting process of a joined body of a semiconductor substrate and a supporting substrate in a method for manufacturing according to an embodiment.

Thereafter, as shown in FIG. 13, the joined body 9 of the semiconductor substrate 2 and the supporting substrate 8 is cut by a dicing blade 15 to section the semiconductor devices 1 from the joined body 9, whereby a semiconductor device (semiconductor chip) 1 shown in FIG. 1 is fabricated. Cutting by the dicing blade 15 is performed along the device regions of the semiconductor substrate 2. Cutting of the joined body 9 is performed in the outer sides than the intercalated portions 10 provided in the device region. The end surfaces of the semiconductor substrate 2, the insulating layer 6 and the supporting substrate 8 are exposed to cross sections. Thus, even if peeling along a joint surface B occurs in the cross section (outer peripheral surface of the semiconductor device 1), progress of peeling can be obstructed by the intercalated portion 10.

Therefore, it is possible to suppress deterioration of a manufacturing yield of the semiconductor device 1 due to separation of the semiconductor substrate 2 and the supporting substrate 8, fracture of the semiconductor substrate 2 or the like, which is caused by progress of peeling. Further, it is possible to suppress deterioration of reliability of the semiconductor device 1 due to progress of peeling and deterioration of a performance characteristic such as an image pick up characteristic of the semiconductor device 1 due to warpage or distortion of the light receiving surface 2b of the semiconductor substrate 2. As described above, it becomes possible to provide a semiconductor device 1 whose reliability, performance characteristic or the like is improved, at a high yield.

By surrounding the active layer and the external electrode 7 by the intercalated portion 10, it is possible to repeatably obstruct peeling having occurred in the joint surface B of the cross section (outer peripheral surface of the semiconductor 1) from progressing to a forming region of the active layer 3 or of the external electrode 12. Protection of the forming region of the active layer 3 from peeling contributes to improvement of mechanical reliability or of the performance characteristic such as an image pick up characteristic. Further, by getting peeling not to progress to the forming region of the external electrode 12, cutting of electrical connection can be prevented.

While certain embodiments have been described, these embodiments have been presented by way of example only, and are not intended to limit the scope of the inventions. Indeed, the novel methods described herein may be embodied in a variety of other forms; furthermore, various omissions, substitutions, and changes in the form of methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate having a first surface on which an active layer having a light receiving portion is provided and a second surface to be a light receiving surface for the light receiving portion;
   a wiring layer provided on the active layer;
   an insulating layer provided to cover the wiring layer;
   a supporting substrate joined to the semiconductor substrate via the insulating layer, to face the first surface of the semiconductor substrate; and
   an intercalated portion provided between an outer peripheral surface of a joined body of the semiconductor substrate and the supporting substrate and the active layer, to penetrate the semiconductor substrate and the insulating layer from the second surface of the semiconductor substrate and to reach inside the supporting substrate.

2. The semiconductor device as set forth in claim 1, wherein at least part of the intercalated portion is provided at a position apart from the outer peripheral surface of the joined body.

3. The semiconductor device as set forth in claim 2, wherein the intercalated portion is provided at a position in which a distance from the outer peripheral surface of the joined body is in a range of 5 μm to 300 μm.

4. The semiconductor device as set forth in claim 1, wherein the intercalated portion is provided in a manner to surround the active layer.

5. The semiconductor device as set forth in claim 1, wherein the intercalated portion comprises a groove penetrating the semiconductor substrate and the insulating layer from the second surface of the semiconductor substrate and reaching the inside of the supporting substrate, and a cover layer provided in a manner to cover at least an inner wall surface of the groove.

6. The semiconductor device as set forth in claim 5, wherein the intercalated portion comprises a filling layer embedded in the groove as the cover layer.

7. The semiconductor device as set forth in claim 5, wherein the cover layer is made of a metal material or an insulating material.

8. The semiconductor device as set forth in claim 5, wherein the intercalated portion comprises the groove formed by laser grooving, and an alteration layer by the laser grooving, the alteration layer being formed on the inner wall surface of the grove as the cover layer.

9. The semiconductor device as set forth in claim 5, wherein the groove has a shape in which a width is in a range of 5 μm to 100 μm and a depth in the supporting substrate is in a range of 1 μm to 20 μm.

10. The semiconductor device as set forth in claim 1, wherein the semiconductor substrate has a thickness equal to or thinner than 20 μm.

11. The semiconductor device as set forth in claim 1, wherein the supporting substrate is made of a silicon substrate, a glass substrate or a resin substrate.

\* \* \* \* \*